(12) United States Patent
Daga

(10) Patent No.: US 7,450,429 B2
(45) Date of Patent: *Nov. 11, 2008

(54) METHOD AND APPARATUS FOR A DUAL POWER SUPPLY TO EMBEDDED NON-VOLATILE MEMORY

(75) Inventor: Jean-Michel Daga, Roussett (FR)

(73) Assignee: Atmel Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/539,567

(22) Filed: Oct. 6, 2006

(65) Prior Publication Data

US 2007/0086248 A1   Apr. 19, 2007

Related U.S. Application Data

(63) Continuation of application No. 11/061,799, filed on Feb. 18, 2005, now Pat. No. 7,120,061.

(30) Foreign Application Priority Data

Apr. 1, 2004   (FR) .................................. 04 03434

(51) Int. Cl.
   *G11C 16/08* (2006.01)
(52) U.S. Cl. ............................ 365/185.23; 365/185.18
(58) Field of Classification Search ............ 365/185.23, 365/185.18, 185.33
   See application file for complete search history.

(56) References Cited

U.S. PATENT DOCUMENTS

| | | | |
|---|---|---|---|
| 5,077,691 A | 12/1991 | Haddad et al. | 365/185.23 |
| 5,222,040 A | 6/1993 | Challa | 365/185.24 |
| 5,274,278 A | 12/1993 | Bauer et al. | 326/106 |
| 5,301,151 A | 4/1994 | Wells et al. | 365/189.09 |

(Continued)

FOREIGN PATENT DOCUMENTS

FR   2864272   *   6/2005

(Continued)

OTHER PUBLICATIONS

Corresponding European Patent Application No. 05729910.9, European Supplementary Search Report, Apr. 4, 2007, pp. 1-3.

*Primary Examiner*—Andrew Q Tran
(74) *Attorney, Agent, or Firm*—Schwegman, Lundberg & Woessner, P.A.

(57) ABSTRACT

A charge pump is configured to receive an external voltage level and generate a high voltage level, wherein the high voltage level is higher than the external voltage level. A memory control circuit is configured to receive the external voltage level and the high voltage level, and to select one of the voltage levels. A memory array, with a word line and a bit line, is configured to receive the external and high voltage levels at the word line and the high voltage levels at the bit line. A word line driver is configured to provide the external and high voltage levels to the word line. A bit line selector is configured to select the bit line and receive the high, external, and regulated voltage levels. A bit line driver is configured to provide the external voltage levels to the bit line selector.

23 Claims, 6 Drawing Sheets

U.S. PATENT DOCUMENTS

| | | | |
|---|---|---|---|
| 5,347,486 A | 9/1994 | Urai | 365/185.25 |
| 5,399,928 A | 3/1995 | Lin et al. | 327/434 |
| 5,483,486 A | 1/1996 | Javanifard et al. | 365/185.17 |
| 5,532,960 A | 7/1996 | Lin et al. | 365/185.29 |
| 5,719,490 A | 2/1998 | Germini | 323/265 |
| 6,128,242 A | 10/2000 | Banba et al. | 365/226 |
| 6,201,747 B1 | 3/2001 | Venkatesh et al. | 365/201 |
| 6,297,991 B1 | 10/2001 | Ozoe | 365/185.23 |
| 6,356,499 B1 | 3/2002 | Banba et al. | 365/226 |
| 6,498,761 B2 | 12/2002 | Banba et al. | 365/226 |
| 6,515,912 B1 | 2/2003 | Tao et al. | 365/185.28 |
| 6,550,028 B1 | 4/2003 | Akaogi et al. | 714/721 |
| 6,608,782 B2 | 8/2003 | Hirano | 365/189.09 |
| 6,608,787 B1 | 8/2003 | Daga et al. | 365/203 |
| 6,822,899 B1 | 11/2004 | Boulos et al. | 365/185.09 |
| 6,859,391 B1 | 2/2005 | Combe et al. | 365/185.05 |
| 7,046,076 B2 | 5/2006 | Daga et al. | 327/536 |
| 7,120,061 B2 | 10/2006 | Daga | 365/185.23 |
| 2002/0021611 A1 | 2/2002 | Banba et al. | 365/226 |
| 2002/0191472 A1 | 12/2002 | Okamoto et al. | 365/227 |
| 2005/0212586 A1 | 9/2005 | Daga et al. | 327/536 |

FOREIGN PATENT DOCUMENTS

| | | | |
|---|---|---|---|
| GB | 2343276 A | | 5/2000 |
| WO | WO 2006023146 | * | 3/2006 |

* cited by examiner

METHOD AND APPARATUS FOR A DUAL POWER SUPPLY TO EMBEDDED NON-VOLATILE MEMORY

CROSS REFERENCE TO RELATED APPLICATIONS

This application is a continuation of co-pending of U.S. patent application Ser. No. 11/061,799, filed Feb. 18, 2005, which claims priority to French Patent Application Serial Number 04 03434, filed Apr. 1, 2004, all of which are hereby incorporated by reference as if set forth herein.

BACKGROUND OF THE INVENTION

The invention relates generally to managing voltage differences between shrinking transistor technology and non-volatile memory read/write requirements. Specifically, the invention relates to power supply management for embedded non-volatile memory such as electrically erasable programmable read-only memory (EEPROM) and FLASH memory.

DESCRIPTION OF THE RELATED ART

In order to maintain acceptable power consumption and reliability with advanced technology, supply voltage has been reduced from 5V with 1 µm technology down to 1.8V with 0.18 µm technology. However, supply voltage has not decreased at the system level. Most systems on chips (SOCs) using a 0.18 µm technology are 3.3V compliant, and 5V compliant or tolerant.

FIG. 1 is a schematic illustrating a prior art power supply management system for a memory. SOC 5 illustrates one example of how power is distributed. External voltage level 10, for example 3.3V or 5V, is applied to voltage regulator 15, analog circuit 20, and input/output pads 25. Voltage regulator 15 generates regulated voltage level 30, for example 1.8V for a 0.18 µm logic. Regulated voltage level 30 is applied to memory 40, for example embedded EEPROM and FLASH memory, and advanced logic 35, for example the micro-controller, CMOS memories, glue logic etc.

When memory 40 is supplied with regulated voltage level 30, advanced CMOS logic may be used in memory 40, resulting in improved density and speed. However, using regulated voltage level 30 during memory write and read for memory 40 results in several issues. Memory write and read use higher voltages than supplied by regulated voltage level 30, and the higher voltages are typically reached by larger charge pumps. Because the memory cell current during memory read depends on the word line voltage, boosting the word line above regulated voltage level 30 during read is commonly used to provide better functionality. However, boosting is time and current consuming.

FIG. 2 is a schematic illustrating another prior art power supply management system for a memory. SOC 200 illustrates one example of how power is distributed. External voltage level 210 is applied to voltage regulator 215, analog circuit 220, and input/output pads 225. Voltage regulator 215 generates regulated voltage level 230. Regulated voltage level 230 is applied to advanced logic 235, for example the microcontroller, CMOS memories, glue logic etc.

When memory 240 is supplied with external voltage level 210, charge pump size may be reduced, and boosting during read is typically not performed. However, the logic parts of memory 240 typically use thick oxide devices, because thin oxide devices do not operate at external voltage level 210. Control logic, pre-decoding and output data-path are larger and slower compared to the lower voltage embodiment illustrated in FIG. 1. Furthermore, level shifter 245 interfaces with the inputs and outputs of memory 240, to allow communication with advanced logic 235, which is supplied with regulated voltage level 230.

What is needed is a power management system for memory that allows the use of advanced CMOS logic in memory, resulting in improved density and speed, while also reducing charge pump size, and reducing the need for boosting during read. The invention should reduce the area required by memory, improve speed, reduce power consumption, use available power supply resources, and be scalable.

SUMMARY OF THE INVENTION

The invention consists of a dual power supply memory management system that provides an external voltage level to memory as well as the internally generated voltage level. The low voltage, logic parts of the memory may use thin oxide devices and are supplied by the regulated voltage level, while the external voltage level is directly supplied to the charge pump for memory write, and to the word line and bit line decoding during memory read. The invention allows for high-speed devices for decoding and sensing, while avoiding internal boosting delays during memory read, and avoiding oversizing of the write charge pump.

The invention is an embedded non-volatile memory being driven at an external voltage level and at a regulated voltage level. The external voltage level is higher than the regulated voltage level. The invention comprises the following. A charge pump is configured to receive the external voltage level and generate a high voltage level, wherein the high voltage level is higher than the external voltage level. A memory control circuit is coupled to the charge pump and is configured to receive the external voltage level and the high voltage level. The memory control circuit is further configured to select between and provide the external and the high voltage levels. A memory array, which has a word line and a bit line, is coupled to the memory control circuit. The memory array is configured to store data, to receive the external and high voltage levels at the word line, and to receive the high voltage levels at the bit line. A word line driver is coupled to the memory array and is configured to provide the external and high voltage levels to the word line. A bit line selector is coupled to the memory array and is configured to select the bit line and receive the high, external, and regulated voltage levels. A bit line driver is coupled to the bit line selector and is configured to provide the external and regulated voltage levels to the bit line selector.

DETAILED DESCRIPTION OF THE INVENTION

Figure 1:
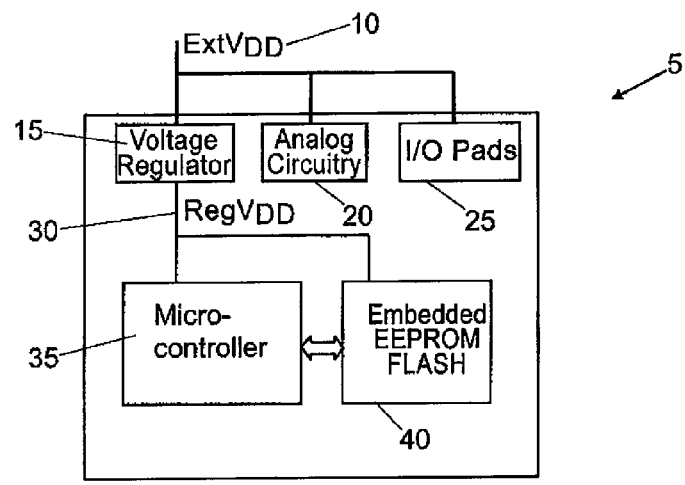
FIG. 1 is a schematic illustrating a prior art power supply management system for a memory.
Figure 2:
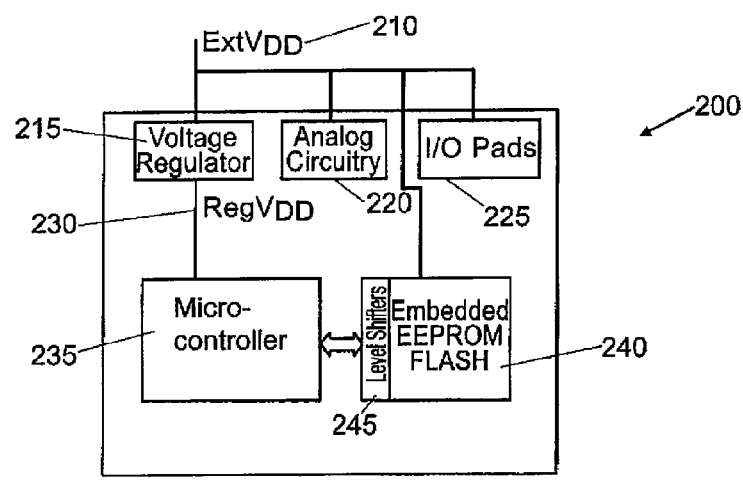
FIG. 2 is a schematic illustrating a prior art power supply management system for a memory.
Figure 3:
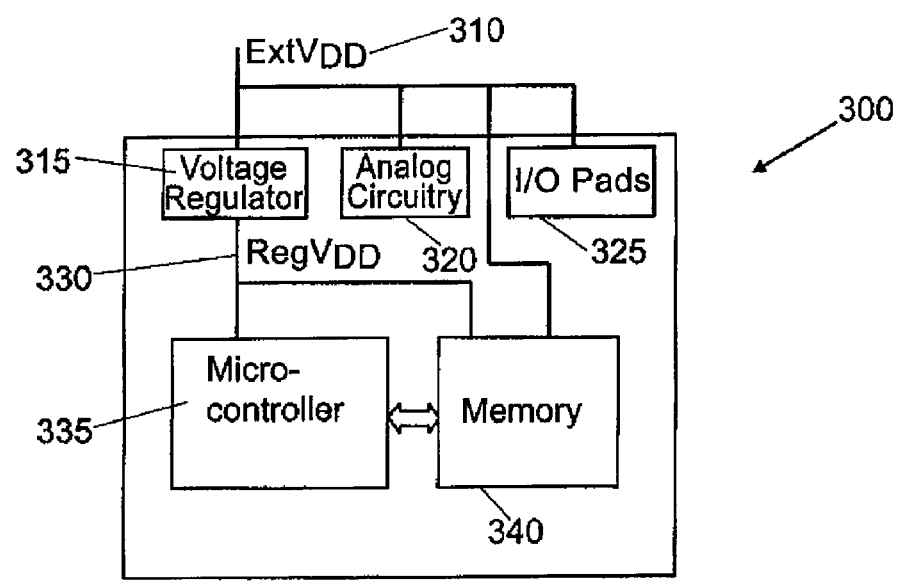
FIG. 3 is a schematic illustrating one embodiment of a power supply management system for memory in a system-on-a-chip (SOC).

FIG. 3 is a schematic illustrating one embodiment of a power supply management system for memory in a system-on-a-chip (SOC). SOC 300 illustrates one example of how power is distributed. External voltage level 310, for example 3.3V or 5V, is applied to voltage regulator 315, analog circuit 320, and input/output pads 325. Voltage regulator 315 generates regulated voltage level 330, for example 1.8V for a 0.18 µm logic. Regulated voltage level 330 is applied to memory 340, for example embedded EEPROM and FLASH memory, and advanced logic 335, for example the micro-controller, CMOS memories, glue logic etc. External voltage level 310 is also applied to memory 340.

Figure 4:
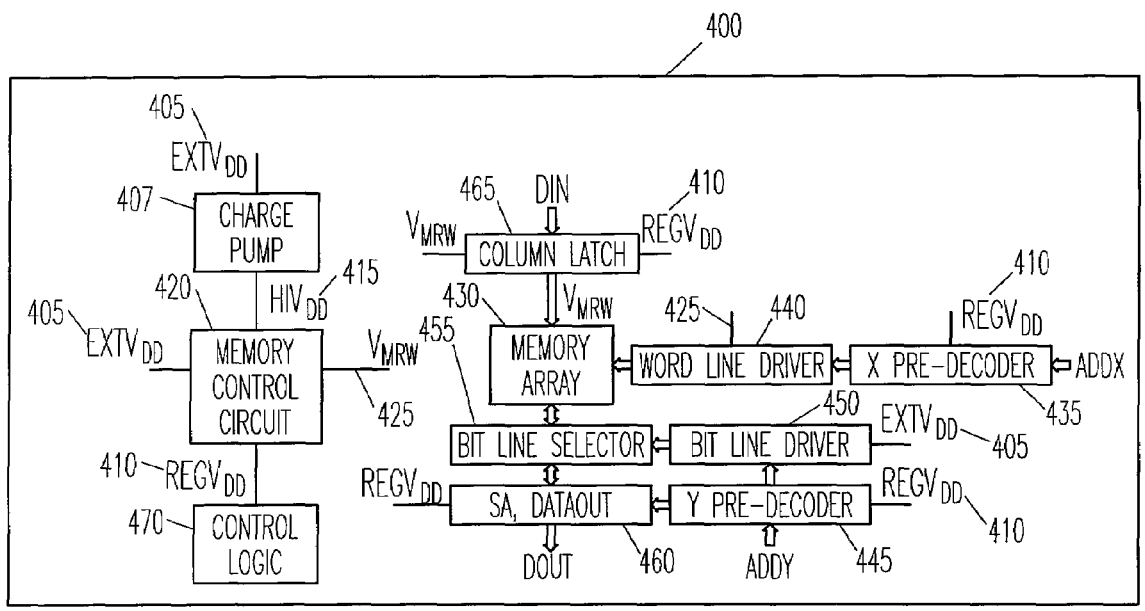
FIG. 4 is a schematic diagram illustrating one embodiment of the memory from FIG. 3.

FIG. 4 is a schematic diagram illustrating one embodiment of memory 340 from FIG. 3. Memory 400 receives external voltage level 405 and regulated voltage level 410 (from voltage regulator 315 of FIG. 3). Charge pump 407 receives external voltage level 405 and generates high voltage level 415, which is used to program memory cells during memory write. Because charge pump 407 is supplied with the higher, external voltage level 405, charge pump 407 may be smaller than a conventional memory charge pump supplied by regulated supply voltage 410.

Memory control circuit 420 receives high voltage level 415 from charge pump 407 and external voltage level 420. Memory control circuit 420 supplies either high voltage level 415 or external voltage level 420 to variable voltage line 425. During a memory read, memory control circuit 420 supplies external voltage level 420 to variable voltage line 425. During a memory write, memory control circuit 420 supplies high voltage level 415 to variable voltage line 425.

Memory 400 includes memory array 430 with memory cells, word lines and bit lines (not shown). X pre-decoder 435 receives and decodes an address and is powered at regulated voltage level 410. X pre-decoder 435 is connected to word line driver 440 with a word select input line (see FIG. 6). Word line driver 440 receives power from variable voltage line 425 and receives a word select that indicates a word line to supply with power. During memory read, word line driver 440 supplies the word line with external voltage level 405. During memory write, word line driver 440 supplies the word line with high voltage level 415.

Y pre-decoder 445 receives and decodes an address and is powered at regulated voltage level 410. Y pre-decoder 445 is connected to select driver 450. Select driver 450 receives external voltage level 405 and a bit select signal from Y pre-decoder 445, which is shifted to external voltage level 405 due to the level shifter.

Bit line selector 455 is connected to select driver 450 and receives a dual powered signal from select driver 450, at regulated voltage level 410 and external voltage level 405. Bit line selector 455 selects bit lines in memory array 430 for memory read.

Sense amplifier 460 with a data output is connected to bit line select 455. Sense amplifier 460 receives regulated voltage level 410.

Column latch 465 connects to memory array 430 and stores data that will be programmed in parallel to memory array 430 and drives the cells corresponding to bit lines that are being written to.

Control logic 470 operates at regulated voltage level 410 and manages functional modes, test modes, and writing delays in memory 400.

Figure 5:
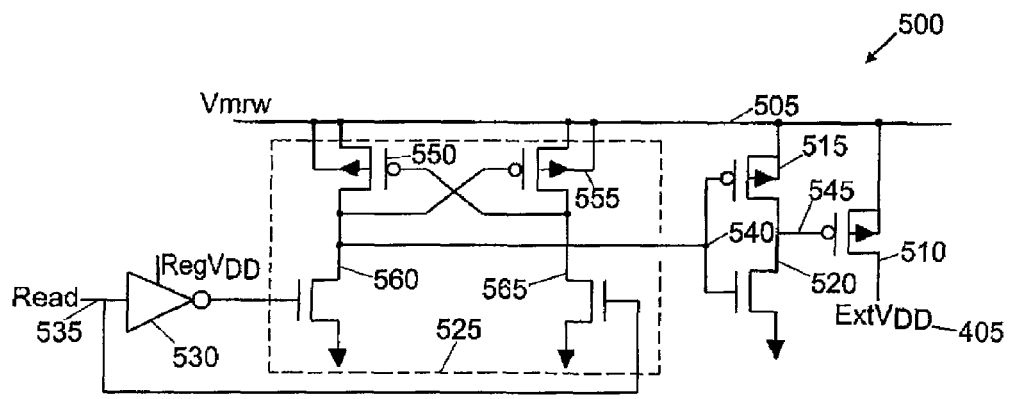
FIG. 5 is a schematic illustrating one embodiment of a memory control circuit.

FIG. 5 is a schematic illustrating one embodiment of memory control circuit 500. Variable voltage line 505 receives high voltage level 415 from charge pump 407 (see FIG. 4). Transistor 510 is, for example, a PMOS transistor with a drain connected to variable voltage line 505 and a source connected to external voltage level 405. The gate of transistor 510 connects to the source of transistor 515 and the drain of transistor 520. The drain of transistor 515 is connected to variable voltage line 505. The source of transistor 520 is connected to ground. The gates of both transistors 515 and 520 are connected together and to level shifter 525. Level shifter 525 is connected to variable voltage line 505, inverter 530, and read signal line 535.

In one embodiment, level shifter 525 receives a read signal indicating memory read from read signal line 535. Level shifter 525 sends a high output to node 540. A high output to the gate of transistor 520 turns it on (asserts it) while a high output to the gate of transistor 515 turns it off (deasserts it). Transistor 520 pulls node 545 to ground, therefore turning on, or asserting transistor 510. Variable voltage line 505, which is now connected to external voltage level 405 through active transistor 510, is at external voltage level 405.

During memory write, level shifter 525 receives a read signal indicating memory write from read signal line 535. Level shifter 525 sends a low output to node 540. A low output to the gate of transistor 520 turns it off (deasserts it) while a low output to the gate of transistor 515 turns it on (asserts it). Transistor 515 pulls node 545 to high voltage level 415, therefore turning transistor 510 off. Variable voltage line 505, which is now isolated from external voltage level 405 through inactive transistor 510, is at high voltage level 415.

One embodiment of level shifter 525 is illustrated in FIG. 5. Transistor 550 is, for example, a PMOS transistor with a drain connected to variable voltage line 505. Transistor 555 is, for example, a PMOS transistor with a drain connected to variable voltage line 505 and a gate connected to the source of transistor 550 and a source connected to the gate of transistor 550. Transistor 560 is, for example, a NMOS transistor with a drain connected to the gate of transistor 555, the source of transistor 550, and node 540, a source connected to ground, and a gate connected to inverter 530. Transistor 565 is, for example, a NMOS transistor with a drain connected to the source of transistor 555 and the gate of transistor 550, a source connected to ground and a gate connected to read signal line 535.

Level shifter 525 receives a read signal indicating memory read, in this case node 535 is set to regulated voltage level 410. The signal is inverted by inverter 530, therefore turning off transistor 560 and turning on transistor 565. The gate of transistor 550 is pulled low, therefore turning it on. The gate of transistor 555 is pulled high, therefore turning it off. Node 540 is pulled high by transistor 550, which is on.

Level shifter 525 receives a read signal indicating memory write, in this case node 535 that is set to ground level. The signal is inverted by inverter 530, therefore turning on transistor 560 and turning off transistor 565. The gate of transistor 550 is pulled high, therefore turning it on. The gate of transistor 555 is pulled low, therefore turning it off. Node 540 is pulled low by transistor 560, which is on.

When beginning memory write, if an undershoot of the potential at node 505 occurs, then the bulk potential at transistor 510 may switch below its source potential, which is directly connected to external voltage level 405. This may result in a substrate parasitic current disturbing the correct functionality of the charge pump.

Figure 10:
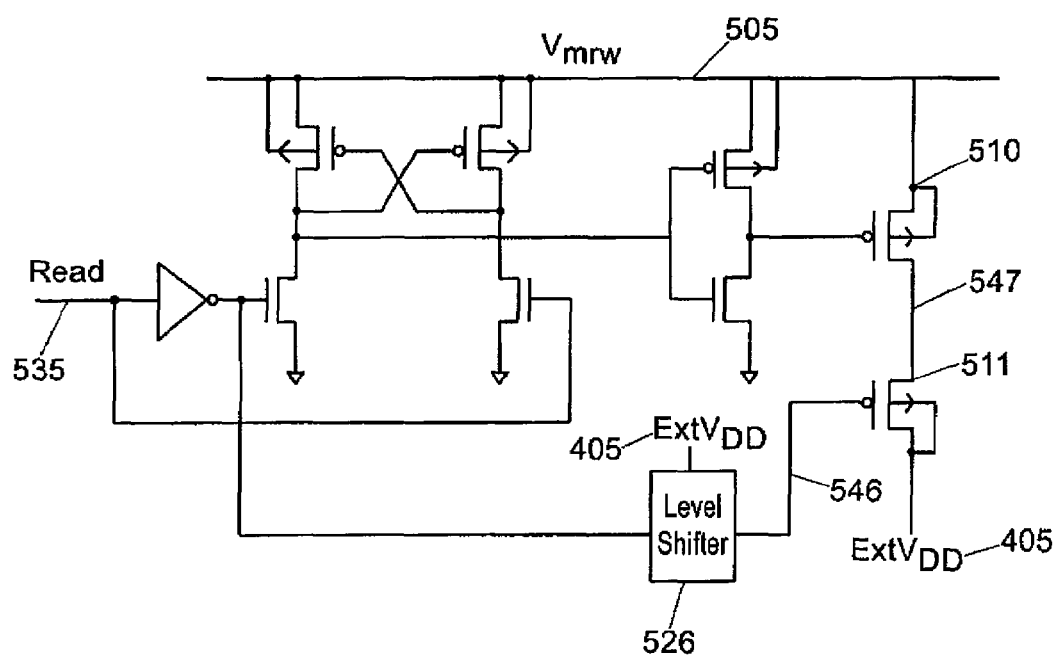
FIG. 10 is a schematic diagram illustrating one embodiment of a memory control circuit.

In order to resolve the issue of the substrate current, transistor 511 has been added, as illustrated in FIG. 10. FIG. 10 is a schematic diagram illustrating one embodiment of memory control circuit 500. Transistor 511 is, for example, a PMOS transistor with its drain connected to the source of transistor 510, its source and bulk connected to external voltage level 405, and its gate connected to the output of level shifter 526. During memory write, node 535 is set to ground, the input of level shifter 526 is set to regulated voltage level 410 and the output of level shifter 526 is external voltage level 405, which turns off transistor 511. The source of transistor 510, which is connected to node 547, is now floating, avoiding substrate parasitic current even during undershoot of its drain.

During a memory read, node 535 is set to regulated voltage level 410. The input and output of level shifter 526 is ground, which turns on transistor 511 and drives node 547 to external voltage level 405. Because transistor 510 is also on, variable voltage line 505 is connected to external voltage level 405 through transistors 510 and 511.

Figure 6:
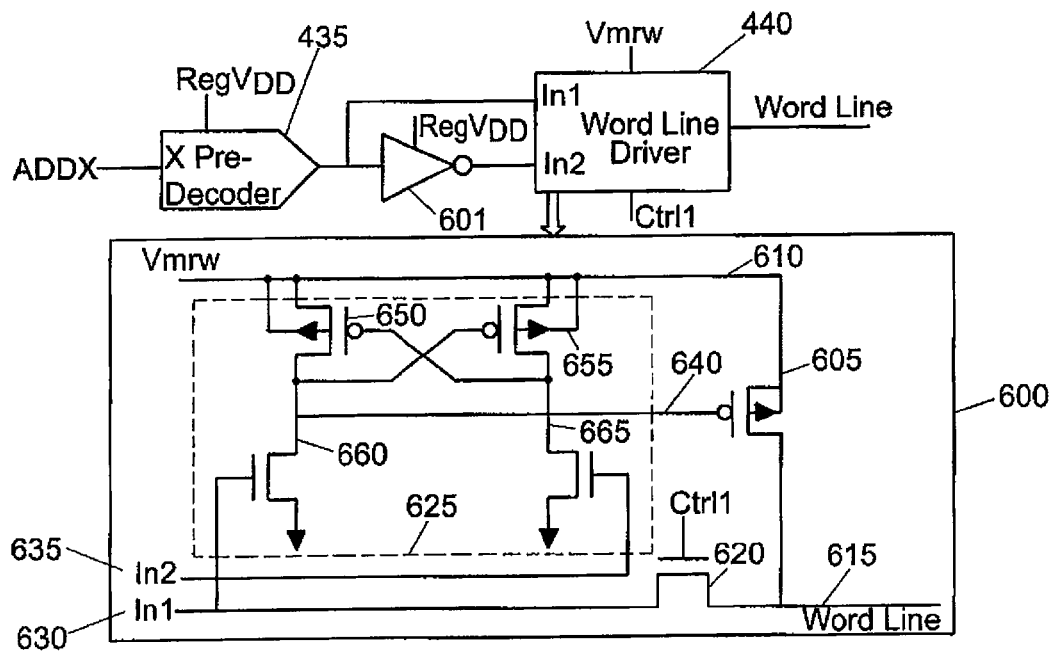
FIG. 6 is a schematic illustrating one embodiment of a word line driver.

FIG. 6 is a schematic illustrating one embodiment of word line driver 440. Word line driver 440 is connected to X pre-decoder 435 directly and through inverter 501. X pre-decoder 435 receives regulated voltage level 410 and memory address locations. Inverter 601 provides an inverted output of its input. Word line driver receives an inverted and normal signal from X pre-decoder 435 and a control signal indicating a memory read.

Word line driver 600 is one embodiment of word line driver 440. Transistor 605 is, for example, a PMOS transistor with a drain connected to variable voltage line 610, a source connected to word line 615. Transistor 620 is, for example, a NMOS transistor with a drain connected to the output of X pre-decoder 435, a source connected to word line 615, and a gate receiving a control signal. Level shifter 625 is connected to variable voltage line 610 and receives the output of inverter 601 and the output of X pre-decoder 435. Level shifter 625 has an output connected to the gate of transistor 605.

If word line 615 is selected by X pre-decoder 435, then input 630 is high and input 635 is low. In this example, high is at regulated voltage level 410 while low is at ground. Level shifter 625 pulls the gate of transistor 605 to ground, therefore turning it on and connecting variable voltage line 610 to word line 615. Given that word line 615 is selected, either memory read or memory write is occurring.

During memory write, memory control circuit 420 provides high voltage level 415 on variable voltage line 610. Transistor 620 receives a control signal at its gate and turns off because memory write is occurring and word line 615 is connected to high voltage level 415.

During memory read, memory control circuit 420 provides external voltage level 405 on variable voltage line 610. Transistor 620 receives a control signal at its gate and turns on because memory read is occurring. Transistor 620 is a low threshold voltage transistor that decreases the word line rising delay during memory read. Transistors 620 and 605 charge word line to regulated voltage level 410 minus the threshold voltage of transistor 620. Once word line 615 reaches regulated voltage level 410 minus the threshold voltage of transistor 620, transistor 620 turns off and the remaining charge to bring word line to external voltage level 405 is supplied by transistor 605.

One embodiment of level shifter 625 is illustrated in FIG. 6. Transistor 650 is, for example, a PMOS transistor with a drain connected to variable voltage line 610. Transistor 655 is, for example, a PMOS transistor with a drain connected to variable voltage line 610 and a gate connected to the source of transistor 650 and a source connected to the gate of transistor 650. Transistor 660 is, for example, a NMOS transistor with a drain connected to the gate of transistor 655, the source of transistor 650, and node 640, a source connected to ground, and a gate connected to X pre-decoder 435. Transistor 665 is, for example, a NMOS transistor with a drain connected to the source of transistor 655 and the gate of transistor 650, a source connected to ground and a gate connected to inverter 601.

Level shifter 625 receives a signal selecting word line 615, in this case regulated voltage level 410. The signal is inverted by inverter 601, therefore turning off transistor 665 and turning on transistor 660. The gate of transistor 655 is pulled low, therefore turning it on. The gate of transistor 650 is pulled high, therefore turning it off. Node 640 is pulled low by transistor 655, which is on, therefore turning on transistor 605.

Level shifter 625 receives a signal deselecting word line 615, in this case the gate of transistor 660 is connected to ground, and the gate of transistor 665 is connected to regulated voltage level 410, therefore turning on transistor 665 and turning off transistor 660. The gate of transistor 655 is pulled high, therefore turning it on. The gate of transistor 650 is pulled low, therefore turning it off. Node 640 is pulled high by transistor 560, which is on, therefore turning off transistor 605.

One example of a prior art 2 megabit EEPROM in 0.18 μm technology, with 1.8V single supply operation, takes 11 ns to charge the word line to 2V and 20 ns to charge the word line to 2.5V. The invention provides a charge time for the word line of 5 ns and 9 ns, respectively.

Figure 7:
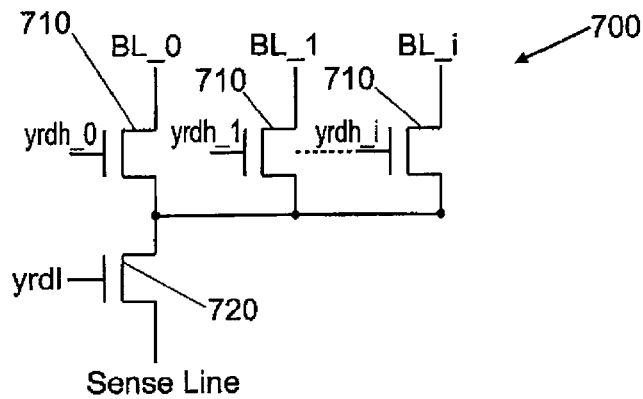
FIG. 7 is a schematic illustrating one embodiment of a bit line selector.

FIG. 7 is a schematic illustrating one embodiment of bit line selector 455. Bit line selector 700 includes transistors 710, which in one embodiment are NMOS, thick oxide, large effective length, poor gain devices. During memory write, transistors 710 are connected to high voltage level 415. Transistors 710 have a drain connected to memory cells (not shown) in memory array 430 (see FIG. 4). Each of transistors 710 has a source connected to the drain of transistor 720. In one embodiment, transistor 720 is a thin oxide, high drive device with a source connected to sense amplifier 460. Transistor 720 is not connected to high voltage level 415.

In order to charge the bit line quickly during read, transistors 710 should operate quickly. One method of speeding operation time of transistors 710 is by increasing their width. Another solution is to drive the gates of transistors 710 to external voltage level 405. When a bit line is selected, the gate of one of transistors 710 will be driven to external voltage level 405 in order to decrease bit line charge time. The gate of transistor 720 will be driven to regulated voltage level 410. Bit line driver 450 drives transistors 710 and 720.

Figure 8:
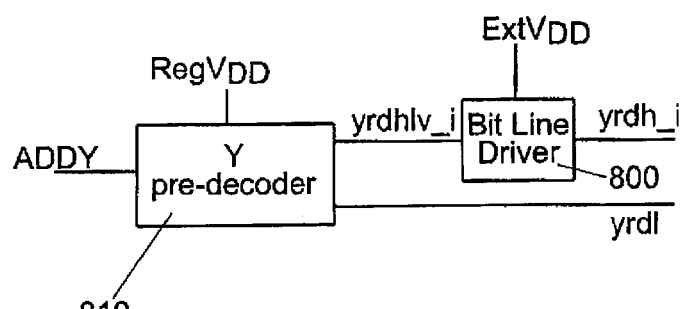
FIG. 8 is a schematic illustrating one embodiment of a bit line driver.

FIG. 8 is a schematic illustrating one embodiment of bit line driver 450. Bit line driver 800 receives a signal from Y pre-decoder 810 at regulated voltage level 410 indicating which one of transistors 710 should be selected. In one embodiment, bit level driver 800 is a level shifter that receives external voltage level 405 and applies external voltage level 405 to the gate of selected transistor 710.

Y pre-decoder 810 receives and decodes an address indicating which of transistors 710 to select and selecting transistor 720 by applying regulated voltage level 410 to the gate of transistor 720.

One example of a prior art 2 megabit EEPROM in 0.18 μm technology, with 1.8V single supply operation, takes 40 ns for memory access time. The invention provides an access time of 25 ns.

Figure 9:
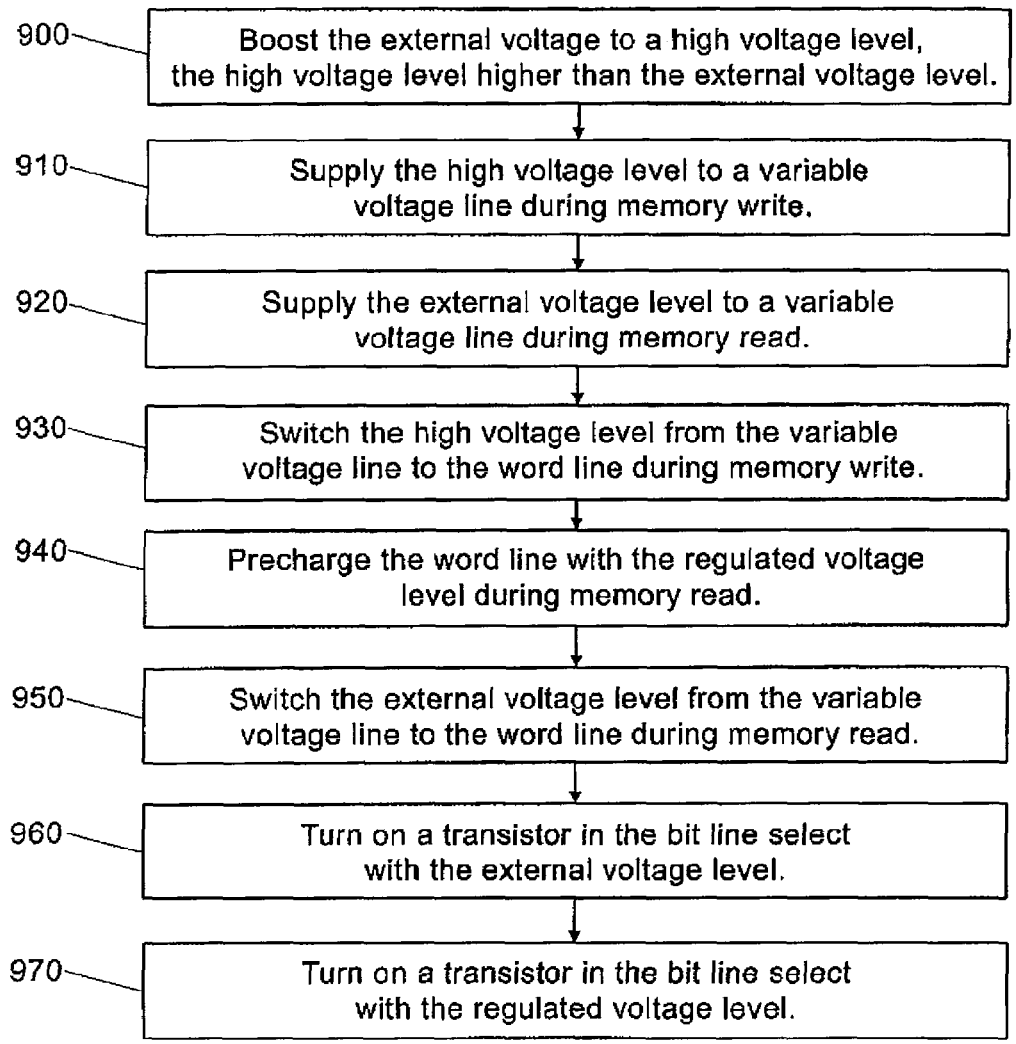
FIG. 9 is a flow diagram illustrating a method of driving an embedded non-volatile memory.

FIG. 9 is a flow diagram illustrating a method of driving an embedded non-volatile memory, having a word line and a bit line, at an external voltage level and at a regulated voltage level, the external voltage level higher than the regulated voltage level lower. In block 900, boost the external voltage level to a high voltage level, the high voltage level higher than the external voltage level. In block 910, supply the high voltage level to a variable voltage line during memory write. In block 920, supply the external voltage level to the variable voltage line during memory read. In block 930, switch the high voltage level from the variable voltage line to the word line during memory write. In block 940, precharge the word line with the regulated voltage level during memory read. In block 950, switch the external voltage level from the variable voltage line to the word line during memory read. In block 960, turn on a transistor in the bit line select with the external voltage level. In block 970, turn on a transistor in the bit line select with the regulated voltage level.

The advantages of the invention include a reduced chip area achieved by reducing the size of the charge pump and bit line select, improved speed, reduced power consumption (boost pump during read is not required), and use of available power supply resources. The invention may apply to embedded FLASH and is scalable. The invention may be applied in embedded applications where thin oxide, low voltage devices requiring a dedicated regulated low voltage are needed for advanced digital logic, while thick oxide devices may be used for a variety of memory. With deep, submicron technologies, this concept applies to SRAM and DRAM memory, where thick oxide, high threshold voltage devices may be used in the array in order to prevent leakage current, for example. The invention may be applied in stand-alone memory as well, in order to optimize speed and decrease control logic area.

One of ordinary skill in the art will recognize that configurations of different circuit components may be used without straying from the invention. The illustrated embodiments of the invention include, for example P and N transistors, and invertors, but one skilled in the art recognizes that these may be interchanged and/or replaced by components with similar functionality, applying appropriate circuit rerouting. As any person skilled in the art will recognize from the previous description and from the figures and claims that modifications and changes can be made to the invention without departing from the scope of the invention defined in the following claims.

What is claimed is:

1. An integrated circuit including:
    a supply-voltage input node driven by an external supply-voltage;
    a voltage regulator having an input coupled to the supply-voltage input node and a voltage-regulator output supplying a regulated voltage;
    a charge pump having an input coupled to the supply-voltage input node and a charge-pump output supplying a high voltage having a value higher than the external supply-voltage;
    a memory array having a plurality of memory cells coupled to word lines and bit lines;
    a word-line driver coupled to the memory array to provide the external supply-voltage and high voltage to the word lines;
    a decoder coupled to the word-line driver;
    a bit line selector coupled to the memory array to select the bit lines;
    a bit line driver coupled to the bit line selector to drive the bit line selector:
    a memory control circuit coupled to the supply-voltage input, the charge-pump output, to the voltage-regulator output, to the word-line driver, and to the bit-line selector, the memory control circuit configured to receive a read/write signal and to selectively couple one of the charge-pump output and the supply-voltage input node to the word line driver and the bit-line selector.

2. The integrated circuit of claim 1 further including:
    a variable voltage line coupled to the charge-pump output;
    a first transistor coupled between the variable voltage line and the supply-voltage input node;
    a level shifter having an input coupled to the read/write signal and an output coupled to a gate of the first transistor, the level shifter turning on the first transistor in response to the read/write signal indicating a read operation and turning off the first transistor in response to the read/write signal indicating a write operation; and
    wherein the variable voltage line is coupled between the memory control circuit and the word line driver, and the bit-line selector.

3. The integrated circuit of claim 2 further comprising:
    a second transistor having a drain coupled to the variable voltage line, a gate coupled to the level shifter output, and a source coupled to the gate of the first transistor; and
    a third transistor having a drain coupled to the source of the second transistor and the gate of the first transistor, a source coupled to a ground voltage, and a gate coupled to the level shifter.

4. The integrated circuit of claim 3 wherein the level shifter comprises:
    a cross-coupled latch having the input coupled to the read/write signal through an inverter and having the output coupled to the gates of the second and third transistors.

5. The integrated circuit of claim 2 wherein the first transistor is coupled between the variable voltage line and the supply-voltage input node through a transistor having its source and bulk coupled to the supply-voltage input node, its drain coupled to the drain of the first transistor and a gate coupled to a second level shifter that outputs the external supply voltage during memory write operations and outputs ground potential during memory read operations.

6. The integrated circuit of claim 2 wherein the word line driver further includes:
    a first word-line driver transistor coupled between the variable voltage line and an individual word line, the first word-line driver transistor having a gate;
    a second word-line driver transistor coupled between the individual word line and the supply-voltage input node, the second word-line driver transistor having a gate coupled to a memory-read enable signal; and
    a second level shifter formed from a cross-coupled latch powered from the variable voltage line and having an input coupled to a word-line select signal from the decoder and an output coupled to the gate of the first word-line driver transistor, the second level shifter assuming a first state when the individual word line is selected and a second state when the individual word line is de-selected.

7. The integrated circuit of claim 6 wherein the word line select signal is at the regulated voltage level.

8. The integrated circuit of claim 7 wherein the second word-line driver transistor is biased during a memory read operation to supply current to the word line only until the word line reaches a voltage equal to the regulated voltage minus the threshold voltage of the second word-line driver transistor.

9. An integrated circuit including:
   a supply-voltage input node driven by an external supply-voltage;
   a voltage regulator having an input coupled to the supply-voltage input node and a voltage-regulator output supplying a regulated voltage;
   a charge pump having an input coupled to the supply-voltage input node and a charge-pump output supplying a high voltage having a value higher than the external supply-voltage;
   a memory array having a plurality of memory cells coupled to word lines and bit lines;
   a word-line driver coupled to the memory array to provide the external supply-voltage and high voltage to the word lines;
   a bit line selector coupled to the memory array to select the bit lines, the bit line selector including a plurality of first transistors and a second transistor, wherein each drain of the plurality of first transistors coupled to a different memory cell in the memory array and each source of the plurality of first transistors coupled to the drain of the second transistor and the source of the second transistor coupled to a sense amplifier;
   a bit line driver coupled to the bit line selector and, during a read, configured to drive the gate of one of the plurality of first transistors to the external voltage level when a bit line is selected and drive the gate of the second transistor to the regulated voltage level; and
   a memory control circuit coupled to the supply-voltage input, the charge-pump output, to the voltage-regulator output, to the word-line driver, and to the bit-line selector, the memory control circuit configured to receive the external supply-voltage and the high voltage, and select between the external supply-voltage and the high voltage.

10. The integrated circuit of claim 9, wherein the memory control circuit further comprises:
    a variable voltage line configured to supply the high and external voltage levels;
    a third transistor coupled to the variable voltage line and configured to receive the external voltage level and convey the external voltage level to the variable voltage line; and
    a level shifter coupled to the third transistor and configured to receive a read signal and assert the third transistor when the read signal indicates a memory read and deassert the third transistor when the read signal does not indicate a memory read, wherein the third transistor conveys the external voltage level to the variable voltage line during the memory read, otherwise the variable voltage line conveys the high voltage level.

11. The integrated circuit of claim 10, further comprising:
    a fourth transistor having a drain coupled to the variable voltage line, a gate coupled to the level shifter, and a source coupled to a gate of the third transistor; and
    a fifth transistor having a drain coupled to the source of the fourth transistor and the gate of the third transistor, a source coupled to a ground potential, and a gate coupled to the level shifter, wherein the fifth and fourth transistors are configured to assert the third transistor when the read signal indicates a memory read and deassert the third transistor when the read signal does not indicate a memory read.

12. The integrated circuit of claim 11, further comprising:
    an inverter having an input configured to receive the read signal and an output coupled to the level shifter.

13. The integrated circuit of claim 9, wherein the word line driver further comprises:
    a variable voltage line configured to supply the high and external voltage levels;
    a third transistor coupled to the variable voltage line and to the word line and configured to receive the external and high voltage levels and convey the external and high voltage levels to the word line; and
    a fourth transistor coupled to the word line and configured to receive a control signal and assist in bringing the word line toward the regulated voltage level when the control signal indicates a memory read, wherein the third transistor conveys the external voltage level to the word line during a memory read, and the third transistor conveys the high voltage level to the word line during a memory write.

14. The integrated circuit of claim 13, further comprising:
    a word select input coupled to the fourth transistor and configured to convey a word line select signal;
    a level shifter coupled to the word select input, the variable voltage line and a gate of the third transistor, the level shifter configured to assert the third transistor if the level shifter received the word line select signal and otherwise deassert the third transistor.

15. The integrated circuit of claim 14, wherein the third transistor further comprises:
    a drain coupled to the variable voltage line and a source coupled to the word line, and the fourth transistor further comprises a drain coupled to the word select input and a source coupled to the word line and a gate configured to receive the control signal.

16. The integrated circuit of claim 15, wherein the word line select signal is at the regulated voltage level.

17. The integrated circuit of claim 16, wherein the fourth transistor, during the memory read, is further configured to supply current to the word line until the word line reaches the regulated voltage level minus the threshold voltage of the fourth transistor, and then stop supplying current as voltage on the word line rises to the external voltage level.

18. The integrated circuit of claim 9, wherein the bit line selector further comprises:
    a third transistor coupled to the bit line and configured to receive the high voltage level during a memory write and to receive the external voltage level during a memory read; and
    a fourth transistor coupled to the third transistor and a sense line, and configured to receive the regulated voltage level during a memory read.

19. The integrated circuit of claim 18, wherein the third transistor further comprises a drain coupled to the bit line and configured to receive the high voltage level during the memory write, a gate configured to receive the external voltage level, and a source.

20. The integrated circuit of claim 19, wherein the fourth transistor further comprises a drain coupled to the source of the third transistor, a gate configured to receive the regulated voltage level, and a drain coupled to the sense line.

21. The integrated circuit of claim 20 further comprising:
    a predecoder configured to receive an address and output the regulated voltage level to the gate of the fourth transistor.

22. The integrated circuit of claim 21, wherein the bit line driver further comprises a level shifter coupled to the predecoder and configured to receive the regulated voltage level from the predecoder and output the external voltage level to the gate of the third transistor.

23. The integrated circuit of claim 9, further comprising:
a predecoder configured to receive an address and output the regulated voltage level; and wherein the bit line driver further comprises a level shifter coupled to the predecoder and configured to receive the regulated voltage level from the predecoder and output the external voltage level.

* * * * *

UNITED STATES PATENT AND TRADEMARK OFFICE
CERTIFICATE OF CORRECTION

PATENT NO. : 7,450,429 B2 Page 1 of 1
APPLICATION NO. : 11/539567
DATED : November 11, 2008
INVENTOR(S) : Daga It is certified that error appears in the above-identified patent and that said Letters Patent is hereby corrected as shown below:

On the title page, item (75), in "Inventor", in column 1, line 1, delete "Roussett" and insert -- Rousset --, therefor.

In column 8, line 4, in Claim 1, delete "selector:" and insert -- selector; --, therefor.

Signed and Sealed this

Twenty-fourth Day of February, 2009

JOHN DOLL
*Acting Director of the United States Patent and Trademark Office*